United States Patent [19]

Kuno et al.

[11] Patent Number: 5,753,538
[45] Date of Patent: May 19, 1998

[54] METHOD OF SEALING ELECTRONIC PARTS WITH MOLDED RESIN AND MOLD EMPLOYED THEREFOR

[75] Inventors: Takaki Kuno; Yoshihisa Kawamoto; Makoto Matsuo; Koichi Araki; Satoshi Nihei, all of Kyoto, Japan

[73] Assignee: Towa Corporation, Kyoto, Japan

[21] Appl. No.: 399,947

[22] Filed: Mar. 6, 1995

[30] Foreign Application Priority Data

Mar. 11, 1994 [JP] Japan .................. 6-067664

[51] Int. Cl.⁶ .................................. H01L 21/56
[52] U.S. Cl. .................. 438/127; 438/115; 249/65; 264/272.17
[58] Field of Search ............... 264/102, 272.17, 264/276; 437/210, 211, 212, 214; 425/542; 249/65

[56] References Cited

U.S. PATENT DOCUMENTS

| | | | |
|---|---|---|---|
| 4,612,149 | 9/1986 | Iseler et al. | 264/101 |
| 4,724,113 | 2/1988 | Lee | 249/65 |
| 4,861,251 | 8/1989 | Moitzger | 264/272.17 |
| 5,082,615 | 1/1992 | Sakai | 264/102 |
| 5,336,272 | 8/1994 | Tsutsumi et al. | 29/25.01 |
| 5,435,953 | 7/1995 | Osada et al. | 264/102 |

FOREIGN PATENT DOCUMENTS

| | | |
|---|---|---|
| 0237871 | 9/1987 | European Pat. Off. . |
| 0265644 | 5/1988 | European Pat. Off. . |
| 2347178 | 11/1977 | France . |
| 3226506 | 3/1983 | Germany . |
| 60-228117 | 11/1985 | Japan . |
| 62-193814 | 8/1987 | Japan .................. 264/102 |
| 63-137815 | 6/1988 | Japan . |
| 4-129714 | 4/1992 | Japan . |
| 6045385 | 2/1994 | Japan . |
| 2252746 | 8/1992 | United Kingdom . |
| 2277294 | 10/1994 | United Kingdom . |
| 2280144 | 1/1995 | United Kingdom . |

OTHER PUBLICATIONS

Cottancin "Faire Le Vide" Pour L'Injection Des Elastomers, Plastiques Modernes & Elastomeres, part 30, May 1978, pp. 85–87.

Meiertoberens et al. Improved Technologies for Elastomer Processing. Part 3. Evacuation and Inert Gas–Flushing of Injection Moulds Gumi Fasern Kunststoffe, International Polymer Science and Technology, Jan. 1994 pp. T/1 to T/9.

*Primary Examiner*—John Niebling
*Assistant Examiner*—Kevin F. Turner
*Attorney, Agent, or Firm*—W. G. Fasse; W. F. Fasse

[57] ABSTRACT

In a method of sealing electronic parts with molded resin, a hollow sealing member is arranged on a mold surface of an upper mold section of a mold comprising the upper mold section and a lower mold section, so that the hollow sealing member is pressurized and expanded to convexly project from the mold surface of the upper mold section. In this state, the lower mold section is upwardly moved to be brought into contact with the expanded hollow sealing member. Further, an internal space portion, including pots, cull portions, resin passages and cavities, which is enclosed with the expanded hollow sealing member is set in a state isolated from the exterior when the upper mold section and the lower mold section are closed, so that the internal space portion is forcibly evacuated in this state. Thus, air, moisture and gases are efficiently and reliably suction-discharged from the internal space portion, whereby the internal space portion is set at a prescribed degree of vacuum. Consequently, it is possible to avoid contamination of air, moisture and the like in melted resin materials, as well as to prevent formation of voids in resin-sealed compacts.

26 Claims, 7 Drawing Sheets

METHOD OF SEALING ELECTRONIC PARTS WITH MOLDED RESIN AND MOLD EMPLOYED THEREFOR

BACKGROUND OF THE INVENTION

1. Field of the Invention

The present invention relates to improvements in a method of sealing electronic parts such as ICs, LSIs, diodes or capacitors which are mounted on lead frames with thermosetting resin materials and a mold employed therefor, and more particularly, it relates to improvements for preventing formation of voids etc. in the interior and the exterior of resin-sealed compacts (mold packages) of such electronic parts.

2. Description of the Background Art

In general, electronic parts are sealed with molded resin by transfer molding, which is carried out through a mold for resin sealing in the following manner, for example:

A fixed upper mold section and a movable lower mold section which are provided on a mold for resin sealing are previously heated by heating means to a resin molding temperature, while the upper and lower mold sections are opened.

Then, lead frames which are provided with electronic parts are set in prescribed positions of a mold surface of the lower mold section, while resin materials (resin tablets) are supplied into pots of the lower mold section.

Then, the lower mold section is upwardly moved so that the upper and lower mold sections are closed. At this time, the electronic parts and the lead frames provided around the same are engaged/set in upper and lower cavities which are oppositely provided in the mold surfaces of the upper and lower mold sections, while the resin tablets introduced into the pots are heated and successively melted.

Then, the resin tablets provided in the pots are pressurized by plungers so that the melted resin materials are injected into and charged in the upper and lower cavities through resin passages, so that the electronic parts and the lead frames provided around the same which are set in the cavities are sealed in resin compacts which are molded in correspondence to the shapes of the cavities.

After a lapse of a time which is necessary for curing the melted resin materials, therefore, the upper and lower mold sections may be opened to release the resin-sealed compacts as well as the lead frames and the cured resin materials from the upper and lower cavities and the resin passages respectively, through a mold release mechanism.

When the upper and lower mold sections are closed, air containing moisture (water) remains in a space portion which is defined between the mold surfaces, i.e., an internal space portion of the mold which is defined by the pots, the resin passages and the upper and lower cavities, and this residual air is disadvantageously mixed into the melted resin materials to form voids etc. in the interior and the exterior of the resin-sealed compacts.

Therefore, the cavities are made to communicate with the exterior of the mold through proper air vents to transfer the melted resin materials from the pots through the resin passages for injecting and charging the same in the upper and lower cavities, thereby naturally discharging the residual air etc. to the exterior through the air vents due to the injecting/charging action.

As hereinabove described, it is possible to naturally discharge the air remaining in the pots, the resin passages and the upper and lower cavities. In practice, however, it is impossible to effectively prevent the resin-sealed compacts from formation of internal voids and defective parts on outer surfaces thereof. Thus, it is impossible to reliably overcome disadvantages such as deterioration of moisture resistance and appearances of the products.

When internal voids are formed in the resin-sealed compacts, the lead frames are deteriorated in adhesion with the resin materials, while water easily infiltrates into the compacts through clearances between the resin materials and the lead frames to deteriorate moisture resistance of the product, for example.

In a step of bending outer leads projecting from the resin-sealed compacts, further, the resin-sealed compacts may be cracked by bending force which is applied to base portions of the outer leads or these portions may be chipped, and hence it is impossible to attain high quality and high reliability which are strongly required for such products.

The internal voids etc. which are formed in the resin-sealed compacts are mainly caused by air and/or moisture contained in the resin tablets.

The aforementioned resin tablets, which are prepared by simply compacting resin powder into prescribed shapes, generally contain a large quantity of air containing atmospheric moisture. Further, such a large quantity of air contained in the resin tablets is present in the state of a number of bubbles which are independent of each other, such that the independent bubbles cannot communicate with each other and with surfaces of the resin tablets.

When the resin tablets are heated to a resin molding temperature of at least 175° C., for example, the air and/or moisture contained in the resin tablets is transformed into steam, which in turn is mixed into the melted resin materials with the aforementioned residual air in the internal space portion and injected and charged in the cavities in this state.

Therefore, voids are formed in the interior and the exterior of the resin-sealed compacts due to the air and/or moisture contained in the resin tablets.

In addition, gases such as volatile gases generated by heating of the resin tablets also serve as factors forming voids in the interior and the exterior of the resin-sealed compacts.

In order to prevent such formation of voids in the interior and the exterior of the resin-sealed compacts, it may be possible to employ the following countermeasures:

There has been proposed a method of arranging sealing members such as O-rings on mold surfaces of upper and lower mold sections and closing the mold sections by connecting the mold surfaces with each other, thereby evacuating the mold through air vents.

In this method, however, a sufficient degree of vacuum cannot be attained since the aforementioned residual air etc. is suction-discharged from the internal space portion through small air vents. Further, this method has hardly been put into practice since a considerably long time is required for attaining a sufficient degree of vacuum and hence respective molding cycle times are too much increased.

Another countermeasure is carried out through a method of arranging bellows-type or cylindrical outside air cutoff means around outer side portions of the mold, for isolating the internal space portion of the mold, defined between the mold surfaces, from the exterior against the outside air and evacuating the mold when the same is closed.

However, such outside air cutoff means tends to be increased in size since the same is arranged in the exterior of the mold, while the large-sized outside air cutoff means must be moved by driving means every molding cycle for opening or closing the mold and a considerably long time is required for such movement. Thus, the large-sized outside air cutoff means cannot be completely moved within the time for a step of opening or closing the mold, and hence a significant influence is exerted on each molding cycle time under the present circumstances.

Particularly when the mold is opened, times for moving the large-sized outside air cutoff means are specifically required for transferring the lead frames to prescribed positions of the mold surfaces and introducing the resin tablets into the respective pots, and for cleaning the mold surfaces. Such movement of the outside air cutoff means cannot be performed within the time for the step of opening the mold, and hence each molding cycle time is generally increased, to increase the overall resin molding time.

In the aforementioned mold, further, the outside air cutoff means is provided around the outer side portions of the mold with provision of the driving means for moving the same, and hence it is necessary to prevent formation of a clearance between the mold and the outside air cutoff means thereby isolating the internal space portion from the exterior against the outside air. Therefore, considerable working accuracy is required for the mold, and the working time thereof is increased.

Thus, the mold is disadvantageously increased in size and the cost for manufacturing the same is increased.

SUMMARY OF THE INVENTION

An object of the present invention is to efficiently and reliably discharge air and/or moisture remaining in an internal space portion of a mold, air and/or moisture contained in resin tablets, and gases generated upon heating of the resin tablets, serving as significant causes for formation of voids in the interior and the exterior of resin-sealed compacts, to the exterior of the internal space portion, thereby preventing the air, moisture and gases from being mixed or entrained into melted resin materials for preventing formation of voids and defective parts in the interior and the exterior of the resin-sealed compacts.

Another object of the present invention is to solve the aforementioned problems which are related to the outside air cutoff means etc. for reducing molding cycle times, thereby reducing the overall resin molding time.

Still another object of the present invention is to miniaturize the aforementioned mold through a structure not utilizing the aforementioned outside air cutoff means, as well as to reduce the manufacturing cost for the mold.

A further object of the present invention is to provide a method of and a mold for sealing electronic parts with molded resin, which can prevent formation of voids and defective parts in the interior and the exterior of resin-sealed compacts for molding products having high quality and high reliability with formation of neither voids nor defective parts in the interior and the exterior of the resin-sealed compacts.

In order to attain the aforementioned objects, a method of sealing electronic parts with molded resin according to an aspect of the present invention comprises:

a hollow sealing member arranging step of arranging a hollow sealing member on a mold surface of at least one mold surface of a mold for resin sealing consisting of a fixed mold section and a movable mold section, a resin tablet supplying step of supplying resin tablets in a plurality of pots which are arranged in the mold respectively, a lead frame supplying step of supplying and setting electronic parts which are mounted on lead frames in prescribed positions of cavities which are arranged in the mold, a resin tablet heating step of heating the resin tablets which are supplied in the pots of the mold, a hollow sealing member expanding step of expanding the hollow sealing member by pressurizing means, an outside air cutoff step of bringing the expanded hollow sealing member into contact with the mold surface of the mold section which is opposed to the hollow sealing member for isolating an internal space portion which is defined between the expanded hollow sealing member and the mold surfaces of the mold by at least the pots, respective resin passages and the cavities from the exterior, an internal space portion evacuating step of forcibly suction-discharging residual air and/or moisture in the internal space portion, air and/or moisture flowing out from the interior of the resin tablets, which are heated/expanded in the resin tablet heating step, into the internal space portion, and gases generated by the heating to the exterior of the internal space portion, thereby improving the degree of vacuum in the internal space portion, a mold closing step of closing the fixed and movable mold sections in a state of engaging the electronic parts which are mounted on the lead frames in the prescribed positions of the cavities, and a resin sealing step of pressurizing the resin tablets which are supplied in the pots of the mold for injecting melted resin materials heated and melted in the respective pots into a prescribed number of cavities which are arranged on side portions of the pots through the resin passages respectively, thereby sealing the electronic parts which are engaged in the cavities with the molded resin materials.

According to the present invention, it is possible to carry out evacuation of forcibly suction-discharging air, moisture and gases from the internal space portion by expanding the hollow sealing member which is arranged on at least one mold surface of the mold consisting of the fixed and movable mold sections for bringing the hollow sealing member into a state convexly expanded on the mold surface and moving the movable mold section in mold closing so that the expanded hollow sealing member is in contact with another mold surface of the mold for completely sealing the internal space portion, including at least the pots, the resin passages and the cavities, which is defined between the mold surfaces of the mold and isolating this internal space portion from the exterior. Consequently, it is possible to efficiently and reliably suction-discharge all of the air, moisture and gases from the internal space portion.

Thus, it is possible to prevent the air, moisture and gases contained in the internal space portion from being mixed or entrained in the melted resin materials, thereby efficiently and reliably preventing formation of voids and defective parts caused by the presence of the air, moisture and gases in the interior and the exterior of resin-sealed compacts.

According to this method, further, it is possible to expand the hollow sealing member within the time for the mold closing step, i.e., substantially simultaneously with closing of the mold, while it is also possible to contract the hollow sealing member to its original shape within the time for a mold opening step, i.e., substantially similarly with opening of the mold. Thus, the hollow sealing member can be expanded and contracted within the times for opening and closing the mold, whereby the times required for expanding and contracting the hollow sealing member exert no influences on the molding cycle time. Therefore, it is possible to reduce each molding cycle time and the overall time for sealing the electronic parts with molded resin as compared with the aforementioned prior art which cannot complete movement of the outside air cutoff means within the times for the steps of opening and closing the mold.

According to another aspect of the present invention, the method of sealing electronic parts with molded resin is carried out by employing a mold having an outside air cutoff member which is engaged with one of fixed and movable mold sections for covering outer peripheral surfaces of the other one and arranging a hollow sealing member on at least either an inner side surface of the outside air cutoff member or an outer peripheral surface of the mold which is opposed thereto. Also in this method, a lead frame supplying step, a resin tablet heating step, a hollow sealing member expanding step, an outside air cutoff step, an internal space portion evacuating step, a mold closing step and a resin sealing step are successively carried out similarly to the aforementioned method.

According to this method, the hollow sealing member is so expanded as to isolate a clearance between the inner side surface of the outside air cutoff member and the outer peripheral surface of the mold from the outside air, whereby no precise dimensional accuracy is required for engaging the outside air cutoff member with the mold. Therefore, no strict working accuracy is required for the outside air cutoff member, whereby the working time can be reduced to save the manufacturing cost.

In a preferred embodiment of the method of sealing electronic parts with molded resin according to each of the aforementioned aspects of the present invention, the mold closing step includes an internal mold closing step of closing the mold while maintaining a prescribed space between the mold surfaces of the fixed and movable mold surfaces in an outside air cutoff state attained through the outside air cutoff step before completely closing the mold for bringing the mold surfaces of the fixed and movable mold sections into contact with each other.

Due to such inclusion of the intermediate mold closing step, it is possible to relatively easily discharge the residual air and/or moisture from the internal space portion to the exterior since the prescribed space is defined between the mold surfaces in the intermediate mold closing.

The intermediate mold closing step is carried out in a state of stopping the movable mold section while maintaining the prescribed space between the mold surfaces, or continuously carried out without stopping the movable mold section by gradually reducing the mold closing speed (the speed for moving the movable mold section) from the intermediate mold closing state of maintaining the prescribed space between the mold surfaces to a complete mold closing state.

The inventive mold which is employed for the method of sealing electronic parts with molded resin according to the aforementioned first aspect of the present invention comprises fixed and movable mold sections which are opposed to each other, with pots for supplying resin materials, resin passages and cavities for molding resin provided in at least one of the fixed and movable mold sections. The mold further comprises:

a hollow sealing member which is arranged in at least one of mold surfaces of the fixed and movable mold sections, and pressurizing means for expanding the hollow sealing member by pressurizing its interior, and evacuation means for forcibly suction-discharging air, moisture and gases from an internal space portion, including the pots, the resin passages and the cavities, which is defined by bringing the hollow sealing member expanded by the pressurizing means into contact with the mold surface opposite to that provided with the hollow sealing member in closing of the fixed and movable mold sections, to the exterior while isolating the internal space portion from the exterior, thereby improving the degree of vacuum in the internal space portion.

Due to the structure of arranging the hollow sealing member on the mold surface without separately providing outside air cutoff means and driving means therefor, it is possible to miniaturize the mold and to reduce the cost for manufacturing this mold.

In a preferred embodiment of the mold according to the present invention, the diameter of each cull portion which is provided in a position of each resin passage opposed to each pot is set to be at least twice that of each pot, thereby increasing the total heating value of such cull portions for heating/melting the resin materials.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to FIGS. 1 to 5C.

Figure 1:
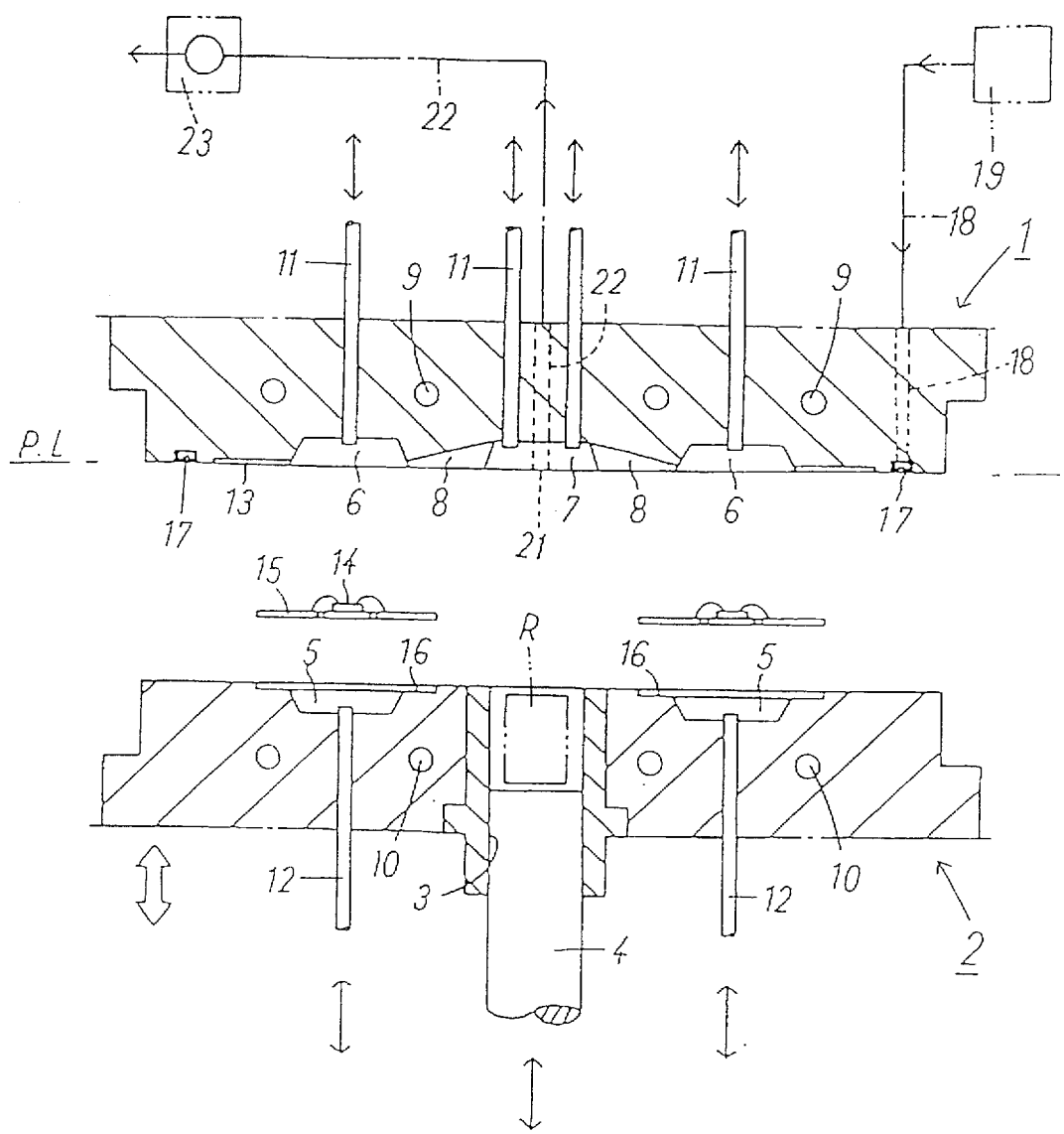
FIG. 1 is a partially fragmented longitudinal sectional view showing a principal part of a mold for sealing electronic parts with molded resin according to an embodiment of the present invention in a state opened before sealing electronic parts with molded resin.

Referring to FIG. 1, a mold for resin sealing according to a first embodiment of the present invention comprises an upper mold section 1 (fixed type) mounted on an upper fixed plate and a lower mold section 2 (movable type) mounted on a lower movable plate, which are opposed to each other.

A plurality of pots 3 are arranged in the lower mold section 2 so that plungers 4 for pressurizing resin materials are engaged in the respective pots 3, while a required number of resin molding cavities 5 are arranged on side portions of the respective pots 3.

On the other hand, cavities 6 corresponding in position and number to the cavities 5 of the lower mold section 2 are oppositely provided in the upper mold section 1, which is also provided with cull portions 7 oppositely to the pots 3 of the lower mold section 2.

The cull portions 7 and the cavities 6 communicate with each other through resin passages 8, whereby the pots 3 and the upper and lower cavities 5 and 6 communicate with each other through the short resin passages 8 including the cull portions 7 when the upper and lower mold sections 1 and 2 are closed.

Further, the upper and lower mold sections 1 and 2 are provided with heating means 9 and 10 such as heaters respectively, as well as with ejector pins 11 and 12 for ejecting and releasing cured resin materials in the resin passages 8 including the cull portions 7 and resin-sealed compacts cured in the upper and lower cavities 5 and 6 respectively.

Therefore, the resin materials which are heated and melted in the pots 3 are pressurized by the plungers 4, and injected into the upper and lower cavities 5 and 6 through the resin passages 8 including the cull portions 7.

The upper cavities 6 are provided with air vents 13.

On the other hand, the lower mold section 2 is provided in its mold surface with concave portions 16 for setting lead frames 15 on which electronic parts 14 are mounted.

Figure 4:
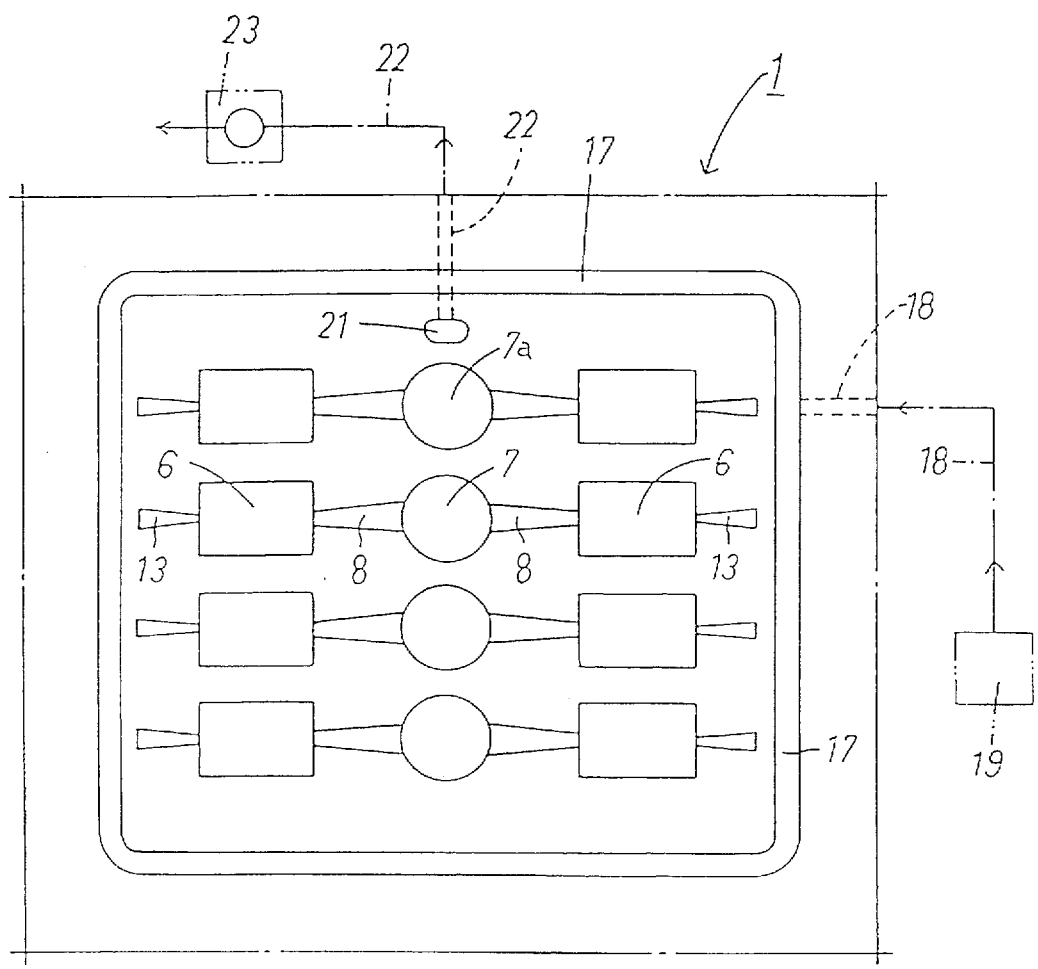
FIG. 4 is a partially fragmented bottom plan view showing a principal part of a mold surface of an upper mold section which is provided in the mold appearing in FIG. 1.
Figure 5A:
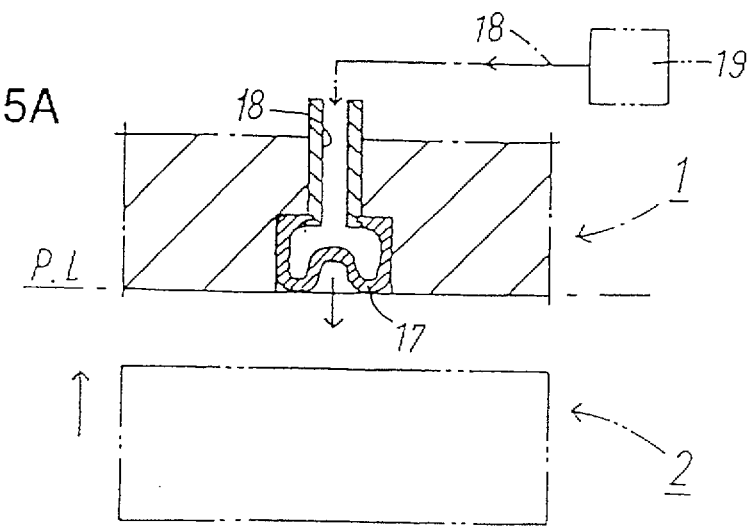
FIG. 5A is a partially fragmented longitudinal sectional view showing the hollow sealing member according to the embodiment in a state before expansion in correspondence to FIG. 1.

As shown in FIG. 4, a hollow sealing member 17 which is in the form of an expandable/contractible cylinder (rubber tube) is embedded in the mold surface of the upper mold section 1 at least around outer peripheries of the cull portions 7, the resin passages 8, the cavities 6 and the air vents 13, for isolating an internal space portion which is defined by at least the pots 3, the resin passages 7 and 8 and the upper and lower cavities 5 and 6 from the exterior against the outside air (see FIG. 5A).

This hollow sealing member 17 communicates with a pressurizing mechanism 19 utilizing a fluid pressure of oil or air, through a pressurization path 18 such as a pressure pipe.

Figure 5B:
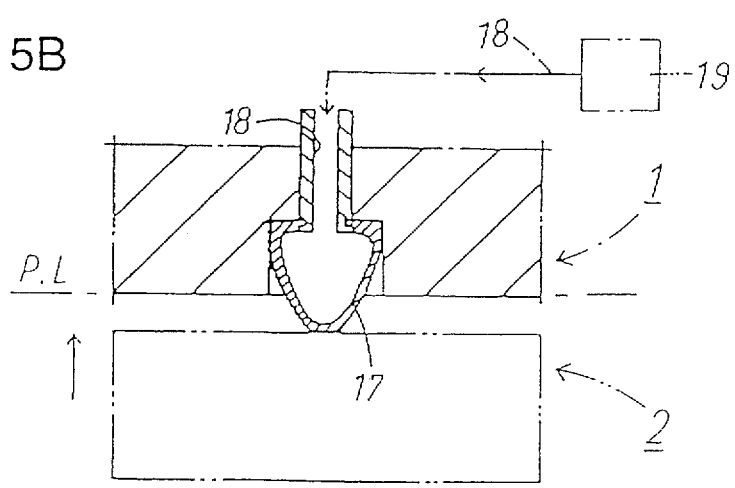
FIG. 5B is a partially fragmented sectional view showing the hollow sealing member in a state expanded and brought into contact with the lower mold section in correspondence to FIG. 2.

Further, the hollow sealing member 17 is made of an elastic material such as heat-resistant rubber or elastomer, for example, and the interior of the cylindrical hollow sealing member 17 is pressurized by the fluid pressure which is applied from the pressurizing mechanism 19, so that the hollow sealing member 17 is expanded (see FIG. 5B).

The position for arranging the hollow sealing member 17 in the upper mold section 1 is not restricted to that shown in FIG. 4, but the position of arrangement and the shape on the mold surface can be arbitrarily set in accordance with the subject matter of the present invention.

The hollow sealing member 17 may alternatively be arranged in the mold surface of the lower mold section 2.

Further, the fluid pressure is not restricted to that of a gas such as air or nitrogen gas or a fluid such as oil or water, but a material having high viscosity or that having viscoelasticity may alternatively be employed.

Expansion of the aforementioned hollow sealing member 17 is now described with reference to FIGS. 5A to 5C.

FIG. 5A shows the hollow sealing member 17 in a state before expansion. On the other hand, FIG. 5B shows the hollow sealing member 17 which is internally pressurized by the pressurizing mechanism 19 and expanded.

The expanded hollow sealing member 17 is in a state convexly formed on the mold surface of the upper mold section 1. Further, this expanded hollow sealing member 17 is in contact with the lower mold section 2 which is upwardly moved (see FIG. 2).

Figure 2:
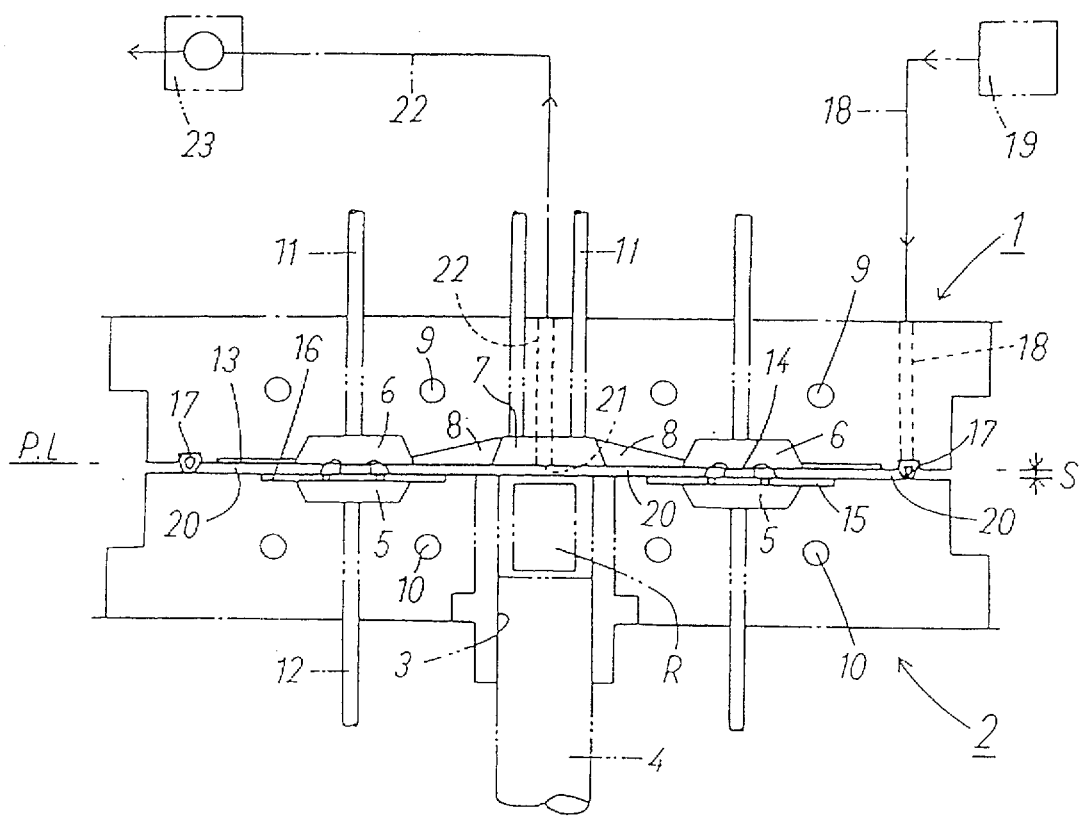
FIG. 2 is a partially fragmented longitudinal sectional view showing the mold appearing in FIG. 1 with a hollow sealing member which is expanded and brought into contact with a mold surface of a lower mold section for defining an outside air cutoff space portion.

When the upwardly moved lower mold section 2 comes into contact with the expanded hollow sealing member 17, an internal space portion 20 (i.e., an outside air cutoff space) which is isolated from the outside air is defined between the expanded hollow sealing member 17 provided in the upper mold section 1 and the mold surfaces of the upper and lower mold sections 1 and 2, at least by the pots 3, the resin passages 7 and 8 and the cavities 5 and 6 of the mold (see FIG. 2).

Figure 5C:
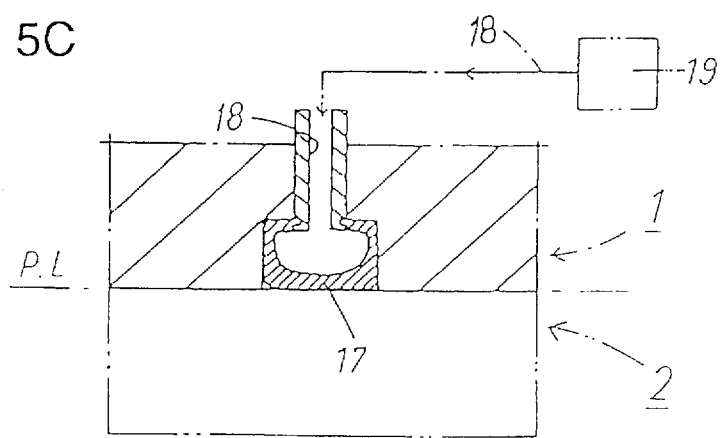
FIG. 5C is a partially fragmented longitudinal sectional view showing the hollow sealing member in a state compressed by the lower mold section in correspondence to FIG. 3 respectively.

FIG. 5C shows the expanded hollow sealing member 17 which is pressed by the upwardly moved lower mold section 2 and compressed in a completely closed state of the upper and lower mold sections 1 and 2.

In this state, the expanded hollow sealing member 17 is continuously pressurized by the pressurizing mechanism 19.

Thus, the hollow sealing member 17 shown in FIG. 5A is expanded by the pressurizing mechanism 19 while the lower mold section 2 is upwardly moved, so that the mold is completely closed as shown in FIG. 5C through the state shown in FIG. 5B.

When the pressure which is applied by the pressurizing mechanism 19 is released, the expanded hollow sealing member 17 shown in FIG. 5B is contracted by its elastic restoring force, to return to the state shown in FIG. 5A.

Referring again to FIG. 4, an exhaust port 21 is provided in an arbitrary portion of the mold surface of the upper mold section 1 which is enclosed with the hollow sealing member 17, for suction-discharging air from the internal space portion 20. This exhaust port 21 is arranged on an upper side of a pot 7a.

This exhaust port 21 communicates with an end of a vacuum path 22 such as a vacuum pipe, while another end of the vacuum path 22 communicates with an evacuation mechanism 23 consisting of a vacuum pump or the like.

Therefore, the air contained in the internal space portion 20 is suction-discharged by the evacuation mechanism 23 in a state isolated from the outside air, for example, so that the internal space portion 20 is set at a prescribed degree of vacuum.

In the aforementioned operation for evacuating the internal space portion 20, it is possible to forcibly suction-discharge residual air and/or moisture in the space portion 20, air and/or moisture flowing out from resin tablets R which are heated and expanded in the pots 3 into the space portion 20, and gases generated by the heating to the exterior of the space portion 20.

The position and the number of arrangement of the exhaust port 21 are not restricted to those of this embodiment, but such exhaust ports 21 may be properly set on the mold surfaces of the upper and lower mold sections 1 and 2.

Alternatively, such exhaust ports 21 may be properly arranged in the cull portions 7, the pots 3 and the air vents 13, for example.

In the upper and lower mold sections 1 and 2, further, appropriate sealing members (not shown) are properly interposed between/arranged on engaging surfaces of the mold members such as the pots 3 and the ejector pins 11 and 12, i.e., clearances between the respective mold members.

Suction discharge of the air etc. from the internal space portion 20 is started by the evacuation mechanism 23 when the upwardly moved lower mold section 2 comes into contact with the expanded hollow sealing member 17 of the upper mold section 1.

An operation of sealing the electronic parts 14 which are mounted on the lead frames 15 with molded resin through mold having the aforementioned structure is now described.

First, the lower mold section 2 is downwardly moved to open the upper and lower mold sections 1 and 2, as shown in FIG. 1. Then, the resin tablets R are supplied into the pots 3 which are arranged in the lower mold section 2 respectively, while the lead frames 15 are supplied/set in the concave portions 16 in the mold surface of the lower mold section 2.

The resin tablets R which are supplied in the respective pots 3 are heated by the heating means 9 and 10 provided on the upper and lower mold sections 1 and 2, expanded and softened, to be successively melted.

Then, the hollow sealing member 17 arranged in the upper mold section 1 is pressurized by the pressurizing mechanism 19, to be expanded (see FIGS. 5A and 5B).

Then, the lower mold section 2 is upwardly moved as shown in FIG. 2 to close the upper and lower mold sections 1 and 2, so that the mold surface of the lower mold section 2 is brought into contact with the expanded hollow sealing member 17 for defining the internal space portion 20 between the expanded hollow sealing members 17 provided in the upper mold section 1 and the mold surfaces of the upper and lower mold sections 1 and 2 at least by the pots 3, the resin passages 7 and 8 and the cavities 5 and 6.

Then, the mold is evacuated by the evacuation mechanism 23 in the aforementioned outside air cutoff state.

Namely, the residual air in the internal space portion 20 is forcibly suction-discharged through the exhaust port 21 which is provided in the mold surface of the upper mold section 1 and the vacuum path 22, to carry out an evacuation step.

As hereinabove described, the resin tablets R which are supplied in the pots 3 are heated by the heating means 9 and 10 provided on the mold sections 1 and 2 to be expanded and softened, while the interior and the exterior of the resin tablets R can be ventilated at this time, so that the air and/or moisture contained therein flows out into the pots 3.

Further, the resin tablets R supplied in the pots 3 are heated to generate gases.

Therefore, it is possible to efficiently and reliably suction-discharge all of the residual air and/or moisture in the space portion 20, the air and/or moisture flowing out from the resin tablets R into the space portion 20 (in the pots 3), and the gases generated by the heating of the resin tablets R into the exterior of the space portion 20 by forcibly evacuating the internal space portion 20 by the evacuation mechanism 23.

Namely, it is possible to improve the degree of vacuum in the space portion 20 to a prescribed level.

In each molding cycle, the upward movement of the lower mold section 2 and the expansion of the hollow sealing member 17 in mold closing, or the downward movement of the lower mold section 2 and the contraction of the hollow sealing member 17 in mold opening are carried out substantially at the same time.

Therefore, the time required for expanding or contracting the hollow sealing member 17 is within the time for the step of opening or closing the mold, thereby exerting no influence on each molding cycle time as compared with the aforementioned structure which cannot complete movement of the outside air cutoff means within the time for the step of opening or closing the mold.

Due to employment of the hollow sealing member 17, further, the mold can be miniaturized with no requirement for the aforementioned large-sized outside air cutoff means and driving means, while the working time of the mold is also reduced. Thus, the cost for manufacturing the mold is economically reduced.

Figure 3:
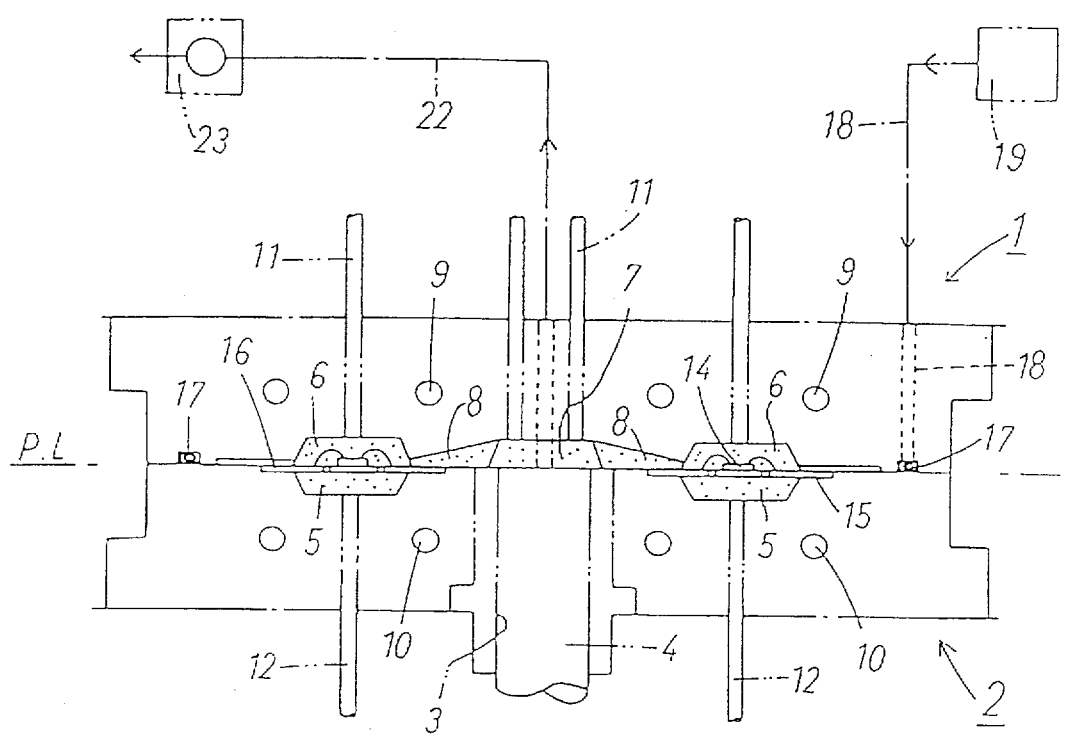
FIG. 3 is a partially fragmented longitudinal sectional view showing the mold appearing in FIG. 1 in a state completely closed for sealing electronic parts with molded resin.

After the upper and lower mold sections 1 and 2 are completely closed, a resin sealing step is carried out for sealing the electronic parts 14 which are mounted on the lead frames 15 in resin-sealed compacts, as shown in FIG. 3. Namely, the resin tablets R provided in the pots 3 are pressurized by the plungers 4 upon complete closing of the upper and lower mold sections 1 and 2, so that the resin materials heated and melted in the pots 3 are injected and charged in a required number of the cavities 5 and 6 which are provided on side positions of the pots 3 through the resin passages 7 and 8, thereby sealing the electronic parts 14 provided on the lead frames 15 which are engaged/set in the cavities 5 and 6 in the resin-sealed compacts.

Then, the upper and lower mold sections 1 and 2 are again opened after a required curing time, for releasing the resin-sealed compacts and the cured resin materials from the upper and lower cavities 5 and 6 and the resin passages 7 and 8 respectively.

Thus, it is possible to forcibly suction-discharge the air, moisture and gases from the internal space portion 20 by the evacuation mechanism 23 while preventing the air, moisture and gases contained in the space portion 20 from being mixed or entrained into the melted resin materials, thereby reliably preventing formation of voids and defective parts caused by presence of the air, moisture and gases in the interior and the exterior of the resin-sealed compacts.

The operation of the evacuation mechanism 23 for forcibly suction-discharging the residual air etc. from the internal space portion 20 to the exterior is continuously carried out also in formation of the internal space portion 20 and complete closing of the upper and lower mold sections 1 and 2.

The hollow sealing member 17 is repeatedly expanded and contracted every molding cycle for sealing the electronic parts 14 with molded resin, while the electronic parts 14 may alternatively be continuously sealed with molded resin in an expanded state of the hollow sealing member 17.

Further, expansion/contraction of the hollow sealing member 17 and upward/downward movement of the lower mold section 2 may be carried out independently of each other.

In the aforementioned embodiment, the following mold closing method may alternatively be employed:

First, the lower mold section 2 is upwardly moved to bring the mold surface of this lower mold section 2 into contact with the expanded sealing member 17, thereby forming an outside air cutoff state by the expanded sealing member 17 and the lower mold section 2.

In this outside air cutoff state, the lower mold section 2 is stopped at a proper position to carry out intermediate closing for defining a required space S between the mold surfaces of the upper and lower mold sections 1 and 2 (see FIG. 2).

Then, residual air etc. contained in the internal space portion 20 which is defined in the aforementioned intermediate closing is forcibly suction-discharged by the evacuation mechanism 23, to set the space portion 20 at a prescribed degree of vacuum.

Then, the mold surfaces of the upper and lower mold sections 1 and 2 are connected with each other to completely close the mold.

In the aforementioned intermediate closing, the required space S is defined in the space portion 20, particularly between the mold surfaces of the upper and lower mold sections 1 and 2, whereby the residual air and/or moisture can be relatively readily discharged from the space portion 20 to the exterior.

When the lower mold section 2 is stopped to carry out the intermediate closing, it is possible to bring the space portion 20 which is defined in the intermediate closing into a prescribed high vacuum state by a vacuum pump (evacuation mechanism 23) of low dischargeability, due to stopping of the lower mold section 2.

In the aforementioned mold closing step, setting of the internal closing state may be continuously performed from the position of the intermediate closing state to the position of the complete closing state while reducing the closing speed (speed for upwardly moving the lower mold section 2) without stopping the lower mold section 2.

A second embodiment of the present invention is now described with reference to FIG. 6.

Figure 6:
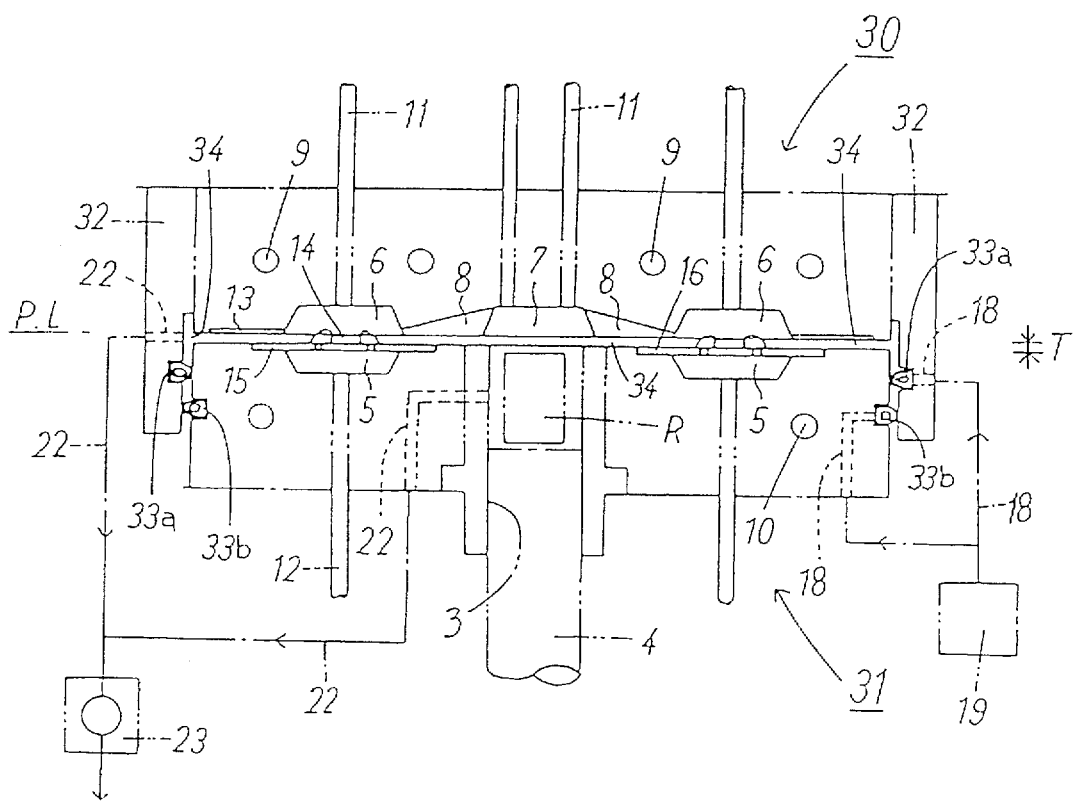
FIG. 6 is a partially fragmented longitudinal sectional view showing a principal part of a mold for sealing electronic parts with molded resin according to another embodiment of the present invention in an intermediately closed state.

Referring to FIG. 6, a mold for resin sealing according to the second embodiment of the present invention comprises upper and lower mold sections 30 and 31 which are opposed to each other.

An outside air cutoff member 32 for enclosing outer side portions of the lower mold section 31 is engaged in the upper mold section 30, so that inner surfaces of the outside air cutoff member 32 and outer side surfaces of the lower mold section 31 are engaged with each other through clearances when the upper and lower mold sections 30 and 31 are closed.

A hollow sealing member 33a is arranged on the inner surfaces of the outside air cutoff member 32, to be expanded and brought into contact with the outer side surfaces of the lower mold 31 when the upper and lower mold sections 30 and 31 are closed.

Another hollow sealing member 33b is also arranged on side surfaces of the lower mold section 31, to be expanded and brought into contact with the inner surfaces of the outside air cutoff member 32.

Further, a pressurizing mechanism 19 is connected to the hollow sealing members 33a and 33b respectively.

In addition, an evacuation mechanism 23 such as a vacuum pump is connected to the outside air cutoff member 32 and pots 3 of the lower mold section 31.

Mold members which are identical to those of the aforementioned embodiment are denoted by the same reference numerals, to omit redundant description.

First, intermediate mold closing is carried out by upwardly moving the lower mold section 31 and stopping the same for defining a required space T between mold surfaces of the upper and lower mold sections 30 and 31.

At this time, the outside air cutoff member 32 arranged on the upper mold section 30 is positioned around the outer side portions of the mold.

Then, the hollow sealing members 33a and 33b are pressurized by the pressurizing mechanism 19 and expanded, for defining an outside air cutoff space portion 34 between the expanded hollow sealing members 33a and 33b, the outside air cutoff member 32 and the mold surfaces of the upper and lower mold sections 30 and 31 at least by the pots 3, resin passages 7 and 8 and cavities 5 and 6.

Then, residual air etc. is forcibly suction-discharged from the outside air cutoff space portion 34 by the evacuation mechanism 23, to improve the degree of vacuum in the outside air cutoff space portion 34.

Then, the mold surfaces of the upper and lower mold sections 30 and 31 are connected with each other to completely close the mold, while electronic parts 14 which are mounted on lead frames 15 are engaged/set in the cavities 5 and 6.

Then, heated/melted resin tablets R are pressurized by plungers 4, so that melted resin materials are injected and charged in the cavities 5 and 6 through the resin passages 7 and 8, for sealing the electronic parts 14 with molded resin.

According to this embodiment, therefore, it is possible to efficiently and reliably suction-discharge all of the residual air and/or moisture in the space portion 34, air and/or moisture flowing out from the resin tablets R into the space portion 34 (in the pots 3) and gases generated by the heating of the resin tablets R into the exterior of the space portion 34 while reliably preventing formation of voids and defective parts caused by presence of the air, moisture and gases in the interior and the exterior of the resin-sealed compacts, by forcibly evacuating the outside air cutoff space portion 34 by the evacuation mechanism 23.

According to this embodiment, further, a clearance between the outside air cutoff member 32 and the lower mold section 31 is isolated from the outside air by expanding the hollow sealing members 33a and 33b, whereby no precise dimensional accuracy is required for the engagement between the outside air cutoff member 32 and the lower mold section 31.

Namely, no strict working accuracy is required and hence the working time is reduced, while it is possible to reduce the manufacturing cost.

This embodiment may simply be provided with only one of the hollow sealing members 33a and 33b.

In opening/closing of the upper and lower mold sections 30 and 31, the outside air cutoff member 32 may be upwardly/downwardly moved along the outer side surfaces of the upper mold section 30.

The present invention is not restricted to the aforementioned embodiments, but modification/selection may be properly and arbitrarily employed at need within the scope of the present invention.

In each of the aforementioned embodiments, it is possible to employ a single pot and a plunger which is engaged in this pot, for injecting and charging a melted resin material in upper and lower cavities through resin passages.

In each of the aforementioned embodiments, further, it is possible to inject and charge the melted resin materials in the upper and lower cavities through the resin passages by slot-shaped pots and plungers corresponding to the slot-shaped pots.

A third embodiment of the present invention is now described with reference to FIG. 7.

For example, the resin tablets R (resin materials) are introduced into the pots 3 of the lower mold section 2 shown in FIG. 1, the upper and lower mold sections 1 and 2 are closed and the resin tablets R provided in the pots 3 are heated and melted by the heating means 9 and 10.

In this case, bottom surface portions of the resin tablets R which are provided in the pots 3 are placed on upper end surfaces of the plungers 4, while slight clearances are defined between side surface portions thereof and inner wall surfaces of the pots 3 and open space portions are defined between upper surface portions thereof and the cull portions 7 (see FIG. 1).

In this state, therefore, conduction heat and radiation heat are applied to the resin tablets R from the bottom surface portions and the side surface portions thereof respectively. Thus, the resin tablets R are heated and melted from the bottom surface portions and the side surface portions, while the upper surface portions thereof are hardly sufficiently heated and melted.

After closing of the upper and lower mold sections 1 and 2, therefore, the resin tablets R are pressurized by the plungers 4 in such a state that the resin materials are not completely melted in the vicinity of the upper surface portions thereof to be pressed against the cull portions 7, while portions close to the upper surface portions of the resin tablets R are heated and melted by the conduction heat from the cull portions 7, and the melted resin materials are transferred to the resin passages 8 to be injected and charged into the upper and lower cavities 5 and 6.

However, the cull portions 7 are generally identical in diameter to the pots 3, and the heating value is insufficient in this state since the diameters of the cull portions 7 are too small. Thus, the resin materials cannot be sufficiently heated and melted before the same are transferred to the resin passages 8.

To this end, this embodiment is adapted to increase the diameters of cull portions as compared with those of pots for increasing the lengths of passages for resin materials which are heated and melted in the cull portions, thereby obtaining a sufficient heating value for heating the resin materials and facilitating the heating/melting action for the resin materials, in order to sufficiently heat and melt resin tablets.

Figure 7:
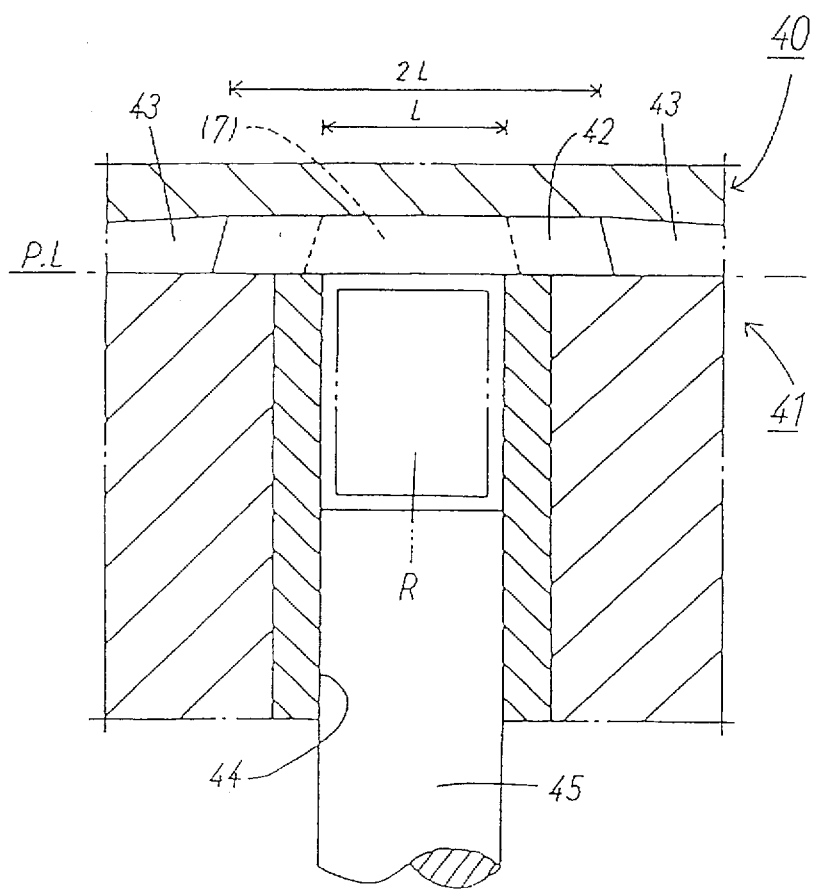
FIG. 7 is a partially fragmented longitudinal sectional view showing a principal part of a mold for sealing electronic parts with molded resin according to still another embodiment of the present invention in a closed state.

As shown in FIG. 7, diameters of pots 44 which are arranged in a lower mold section 41 are set at L while those of cull portions 42 provided in an upper mold section 40 are set to be at least 2 L. Referring to FIG. 7, the aforementioned cull portions 7 are illustrated with dotted lines.

Thus, resin tablets R are heated in the pots 44 and pressurized by plungers 45 so that portions close to upper surface portions of the resin tablets R are pressed against the cull portions 42, whereby it is possible to facilitate heating and melting of the resin tablets R by a sufficient heating value of the cull portions 42 and transferring the same into resin passages 43.

Thus, it is possible to engage/set electronic parts 14 which are mounted on lead frames 15 in upper and lower cavities 5 and 6, while sealing the electronic parts 14 with molded resin materials, which are facilitated in heating/melting in the aforementioned manner.

Heating/melting of the resin tablets R can be further facilitated by the sufficient heating value of the cull portions 42, whereby it is possible to efficiently and reliably remove air, moisture and gases caused by the resin tablets R from the melted resin materials by suction-discharging residual air etc. from the aforementioned internal space portion 20 and bringing the same into a prescribed degree of vacuum.

Thus, it is possible to efficiently and reliably prevent formation of voids and defective parts which are caused by air, moisture and gases contained in the melted resin materials, in the interior and the exterior of resin-sealed compacts which are sealed with molded resin.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of sealing electronic parts with molded resin in a mold including a fixed mold section and a movable mold section, comprising the following steps:

(a) arranging two hollow sealing members respectively on at least one first mold surface of at least one of said fixed mold section and said movable mold section;

(b) supplying resin tablets respectively into a plurality of pots provided in said mold;

(c) setting electronic parts mounted on lead frames respectively into cavities provided in said mold and communicating with said pots through resin passages;

(d) heating said resin tablets in said pots of said mold;

(e) expanding said hollow sealing members by pressurizing means;

(f) bringing said expanded hollow sealing members respectively into hermetic sealing contact with at least one second mold surface of at least one of said fixed mold section and said movable mold section and respectively arranged opposite and facing said hollow sealing members on said at least one first mold surface, and isolating from an exterior environment outside of said mold an internal space in said mold that includes at least said pots, said resin passages and said cavities, by sealing said expanded hollow sealing members between said first and second mold surfaces of said mold, with said two hollow sealing members next to each other and in series with each other between said isolated internal space and said exterior environment;

(g) forcibly suction-discharging at least one of gas and moisture from said isolated internal space to said exterior environment, thereby achieving a degree of vacuum in said isolated internal space;

(h) closing said fixed mold section and said movable mold section so as to engage said electronic parts mounted on said lead frames in said cavities of said mold; and (i) pressurizing said heated resin tablets in said pots of said mold and injecting a melted resin material of said heated resin tablets from said pots into at least some of said cavities through said resin passages, thereby sealing said electronic parts mounted on said lead frames in said cavities with molded resin.

2. The method of claim 1, wherein said step (a) is carried out by engaging said hollow sealing members in respective grooves provided in said at least one first mold surface, and said step (e) is carried out by expanding said hollow sealing members to convexly project from said grooves.

3. The method of claim 1, wherein said step (h) includes an intermediate mold closing step of moving said movable mold section toward said fixed mold section into an intermediate closed state having a prescribed spacing distance between said first and second mold surfaces in advance of a complete mold closing step of bringing said first and second mold surfaces of said fixed mold section and said movable mold section into contact with each other for completely closing said mold in a completely closed state.

4. The method of claim 3, wherein
said intermediate mold closing step comprises stopping said moving of said movable mold section in said intermediate closed state.

5. The method of claim 3, wherein
said intermediate mold closing step comprises moving said movable mold section continuously without stopping while reducing a speed of said moving of said movable mold section from said intermediate closed state to said completely closed state.

6. The method of claim 1, wherein said hollow sealing members respectively comprise contractive tubular members, and said step (a) comprises embedding said tubular members in said at least one first mold surface.

7. The method of claim 6, wherein
said step (e) comprises expanding said hollow sealing members to project respectively along a respective overall length of said sealing members from said at least one first mold surface.

8. The method of claim 6, wherein
said hollow sealing members consist of a heat resistant elastic material.

9. A method of sealing electronic parts with molded resin in a mold including first and second mold sections respectively having first and second mold surfaces facing each other, and an outside air cutoff member engaged with said first mold section so as to overlap an outer peripheral surface of said second mold section with an inner side surface of said air cutoff member facing said outer peripheral surface with a clearance gap therebetween, wherein at least one of said mold sections is movable relative to another of said mold sections, comprising the following steps:

(a) arranging two hollow sealing members in at least one first sealing surface selected from at least one of said inner side surface and said outer peripheral surface;

(b) supplying resin tablets respectively into a plurality of pots provided in said mold;

(c) setting electronic parts mounted on lead frames respectively into cavities provided in said mold and communicating with said pots through resin passages;

(d) heating said resin tablets in said pots of said mold;

(e) expanding said hollow sealing members by pressurizing means;

(f) bringing said expanded hollow sealing members respectively into hermetic sealing contact with at least one second sealing surface that is selected from at least one of said outer peripheral surface and said inner side surface and that is respectively opposite and respectively faces said at least one first sealing surface, and isolating from an exterior environment outside of said mold an internal space in said mold that includes at least said pots, said resin passages and said cavities, by sealing said expanded hollow sealing members between said first and second sealing surfaces, with said two hollow sealing members next to each other and in series with each other between said isolated internal space and said exterior environment;

(g) forcibly suction-discharging at least one of gas and moisture from said isolated internal space to said exterior environment, thereby achieving a degree of vacuum in said isolated internal space;

(h) closing said fixed mold section and said movable mold section so as to engage said electronic parts mounted on said lead frames in said cavities of said mold; and (i) pressurizing said resin tablets in said pots of said mold and injecting melted resin material of said heated resin tablets from said pots into at least some of said cavities through said resin passages, thereby sealing said electronic parts in said cavities with molded resin.

10. The method of claim 9, wherein
said step (a) is carried out by engaging said hollow sealing members in respective grooves provided in said at least one first sealing surface, and
said step (e) is carried out by expanding said hollow sealing members to convexly project from said grooves.

11. The method of claim 9, wherein
one of said first and second mold sections is a movable mold section and the other of said first and second mold sections is a fixed mold section, and
said step (h) includes an intermediate mold closing step of moving said movable mold section toward said fixed mold section into an intermediate closed state having a prescribed spacing distance between said mold surfaces in advance of a complete mold closing step of bringing said mold surfaces of said fixed mold section and said movable mold section into contact with each other for completely closing said mold in a completely closed state.

12. The method of claim 11, wherein said intermediate mold closing step comprises stopping said moving of said movable mold section in said intermediate closed state.

13. The method of claim 11, wherein said intermediate mold closing step comprises moving said movable mold section continuously without stopping while reducing a speed of said moving of said movable mold section from said intermediate closed state to said completely closed state.

14. The method of claim 9, wherein
said hollow sealing members respectively comprise contractive tubular members, and
said step (a) includes a step of embedding said contractive tubular members in said at least one first sealing surface.

15. The method of claim 14, wherein
said step (e) comprises expanding said hollow sealing members to respectively convexly project from said at least one first sealing surface in which said respective tubular member was embedded.

16. The method of claim 9, wherein
members consisting of a heat-resistant elastic material are employed as said hollow sealing members.

17. A method of molding a part with a resin material in a mold including a first mold member having a first surface and a second mold member having a second surface that faces said first surface when said first and second mold members are moved relatively toward one another to close said mold, and having formed in at least one of said mold members a mold cavity, a resin pot and a resin passage communicating said pot with said cavity, and including two hollow seal members respectively arranged on at least one of said first and second surfaces so as to respectively face the respective other opposing one of said first and second surfaces, wherein said method comprises the following steps:

(a) supplying said resin material into said pot;
(b) supplying said part into said mold cavity;
(c) heating said resin material so as to melt said resin material in said pot;
(d) pressurizing respective hollow interiors of said two hollow seal members so as to expand said seal members to respectively protrude from said at least one of said surfaces and moving at least one of said mold members relatively toward the other of said mold members from an open state of said mold, so as to respectively bring said seal members into hermetic sealing contact against said respective other opposing one of said first and second surfaces and to form a sealed interior space in said mold including said cavity, said pot and said resin passage, with said two hollow seal members next to each other and in series with each other between said sealed interior space and an exterior environment outside of said mold;

(e) evacuating at least one of gas and moisture from said sealed interior space to create at least a partial vacuum therein;

(f) completely closing said mold by moving at least one of said first and second mold members completely against the other of said first and second mold members; and (g) injecting said melted resin material from said pot through said resin passage into said cavity so as to mold said part in said resin material.

18. The method of claim 17, wherein said hollow seal members respectively form a continuous closed loop, and wherein said forming of said sealed interior space is achieved by said seal members hermetically sealing said interior space respectively within said continuous closed loop from said exterior environment outside of said mold.

19. The method of claim 17, wherein said pressurizing of said seal members is completed in less time than said moving of at least one of said mold members in said step (d).

20. The method of claim 17, wherein said two seal members are respectively arranged on opposite ones of said first and second surfaces.

21. The method of claim 17, wherein said hollow seal members are arranged in respective grooves in said at least one of said first and second surfaces, and said hollow seal members each have a respective elastic characteristic that urges said seal members to contract into a resting state of said seal members retracted into said grooves without protruding from said at least one of said first and second surfaces, and further comprising after said step g) a step of removing said pressurizing of said hollow interiors of said hollow seal members and contracting and retracting said seal members into said resting state in said grooves under the influence of said respective elastic characteristic.

22. The method of claim 17, wherein said first and second surfaces are respective mold surfaces facing each other along a parting line of said mold between said first and second mold members, and said step (f) comprises contacting said first and second surfaces with each other.

23. The method of claim 17, wherein said first mold member includes a first mold body and an air cut-off member arranged at a first outer peripheral surface of said first mold body, said second mold member includes a second mold body that mates with said first mold body along a parting line of said mold and that has a second outer peripheral surface, and said air cut-off member is adapted to protrude from said first mold body across said parting line and has an inner peripheral surface that is adapted to overlap and face said second outer peripheral surface of said second mold body, and wherein said first and second surfaces of said first and second mold members are respectively said inner peripheral surface of said air cut-off member and said second outer peripheral surface of said second mold body, and wherein said moving of said step (d) brings said inner peripheral surface into a position overlapping and facing said second outer peripheral surface.

24. A method of molding a part with a resin material in a mold including a first mold member having a first surface and a second mold member having a second surface that faces said first surface when said first and second mold members are moved relatively toward one another to close said mold, and having formed in at least one of said mold members a mold cavity, a resin pot and a resin passage communicating said pot with said cavity, and including a hollow seal member arranged on one of said first and second surfaces so as to face the other of said first and second surfaces, wherein said method comprises the following steps:

(a) supplying said resin material into said pot;

(b) supplying said part into said mold cavity;

(c) heating said resin material so as to melt said resin material in said pot;

(d) pressurizing a hollow interior of said hollow seal member so as to expand said seal member to protrude from said one of said surfaces and moving at least one of said mold members relatively toward the other of said mold members from an open state of said mold, so as to bring said seal member into sealing contact against said other of said first and second surfaces and to form a sealed interior space in said mold including said cavity, said pot and said resin passage;

(e) evacuating at least one of gas and moisture from said sealed interior space to create at least a partial vacuum therein;

(f) completely closing said mold by moving at least one of said first and second mold members completely against the other of said first and second mold members; and (g) injecting said melted resin material from said pot through said resin passage into said cavity so as to mold said part in said resin material;

wherein said hollow seal member is arranged in a groove in said one of said first and second surfaces, and said hollow seal member has an elastic characteristic that urges said seal member to contract into a resting state of said seal member retracted into said groove without protruding from said one of said first and second surfaces, and further comprising after said step (g) a step of removing said pressurizing of said hollow interior of said hollow seal member and contracting and retracting said seal member into said resting state in said groove under the influence of said elastic characteristic.

25. A method of sealing electronic parts with molded resin in a mold including a fixed mold section and a movable mold section, comprising the following steps:

(a) arranging a hollow sealing member in a groove in at least one mold surface of a first mold section selected from said fixed mold section and said movable mold section, wherein said hollow sealing member has an elastic characteristic that urges said sealing member to contract into a resting state of said sealing member retracted into said groove without protruding from said at least one mold surface;

(b) supplying resin tablets respectively into a plurality of pots provided in said mold;

(c) setting electronic parts mounted on lead frames respectively into cavities provided in said mold and communicating with said pots through resin passages;

(d) heating said resin tablets in said pots of said mold;

(e) expanding said hollow sealing member by pressurizing means;

(f) bringing said expanded hollow sealing member into contact with a second mold surface of a second mold section selected from said fixed mold section and said movable mold section and arranged opposite and facing said hollow sealing member on said first mold section, and isolating from an exterior environment outside of said mold an internal space in said mold that includes at least said pots, said resin passages and said cavities, by sealing said expanded hollow sealing member between said mold surfaces of said mold;

(g) forcibly suction-discharging at least one of gas and moisture from said isolated internal space to said exterior environment, thereby achieving a degree of vacuum in said isolated internal space;

(h) closing said fixed mold section and said movable mold section so as to engage said electronic parts mounted on said lead frames in said cavities of said mold;

(i) pressurizing said heated resin tablets in said pots of said mold and injecting a melted resin material of said heated resin tablets from said pots into at least some of said cavities through said resin passages, thereby sealing said electronic parts mounted on said lead frames in said cavities with molded resin; and (j) discontinuing said expanding of said hollow sealing member by said pressurizing means, and contracting and retracting said hollow sealing member into said resting state in said groove under the influence of said elastic characteristic.

26. A method of sealing electronic parts with molded resin in a mold including first and second mold sections respectively having first and second mold surfaces facing each other, and an outside air cutoff member engaged with said first mold section so as to overlap an outer peripheral surface of said second mold section with an inner side surface of said air cutoff member facing said outer peripheral surface with a clearance gap therebetween, wherein at least one of said mold sections is movable relative to another of said mold sections, comprising the following steps:

(a) arranging a hollow sealing member in a groove in at least one first sealing surface selected from said inner side surface and said outer peripheral surface, wherein said hollow sealing member has an elastic characteristic that urges said sealing member to contract into a resting state of said sealing member retracted into said groove without protruding from said at least one first sealing surface;

(b) supplying resin tablets respectively into a plurality of pots provided in said mold;

(c) setting electronic parts mounted on lead frames respectively into cavities provided in said mold and communicating with said pots through resin passages;

(d) heating said resin tablets in said pots of said mold;

(e) expanding said hollow sealing member by pressurizing means;

(f) bringing said expanded hollow sealing member into contact with a second sealing surface that is selected from said outer peripheral surface and said inner side surface and that is opposite and faces said first sealing surface, and isolating from an exterior environment outside of said mold an internal space in said mold that includes at least said pots, said resin passages and said cavities, by sealing said expanded hollow sealing member between said first and second sealing surfaces;

(g) forcibly suction-discharging at least one of gas and moisture from said isolated internal space to said exterior environment, thereby achieving a degree of vacuum in said isolated internal space;

(h) closing said fixed mold section and said movable mold section so as to engage said electronic parts mounted on said lead frames in said cavities of said mold;

(i) pressurizing said resin tablets in said pots of said mold and injecting melted resin material of said heated resin tablets from said pots into at least some of said cavities through said resin passages, thereby sealing said electronic parts in said cavities with molded resin; and (j) discontinuing said expanding of said hollow sealing member by said pressurizing means, and contracting and retracting said hollow sealing member into said resting state in said groove under the influence of said elastic characteristic.

* * * * *

UNITED STATES PATENT AND TRADEMARK OFFICE
CERTIFICATE OF CORRECTION

PATENT NO. : 5,753,538

DATED : May 19, 1998

Page 1 of 9

INVENTOR(S) : Kuno et al.

It is certified that error appears in the above-identified patent and that said Letters Patent is hereby corrected as shown below:

On the Title Page, in the Abstract,
    line 1, after "resin" insert --in a mold including an upper mold section and a lower mold section--;
    line 2 replace "an" by --the--;
    line 3, replace "a mold comprising the upper mold" by --the mold,--;
    line 4, cancel the entire line;
    line 5, replace "member is" by --and is then--;
    line 7, delete "to be";
    line 8, delete "brought";
    line 9, replace "member. Further," by --member so that the seal member encloses and seals or isolates from the exterior--, replace "portion" by --of the mold,--;
    line 10, cancel the line and replace to read: --cull portions, resin passages and cavities.--;
    line 11, cancel the entire line;
    line 12, cancel the entire line;
    line 13, cancel the line and replace to read: --Then, the internal space--;
    line 14, delete "portion";
    line 16, delete "portion";
    line 17, delete "portion";
    line 18, replace "of" by --by--;
    line 20, after "prevent" insert --the--.

UNITED STATES PATENT AND TRADEMARK OFFICE
CERTIFICATE OF CORRECTION

PATENT NO. : 5,753,538

DATED : May 19, 1998

INVENTOR(S) : Kuno et al.

It is certified that error appears in the above-identified patent and that said Letters Patent is hereby corrected as shown below:

Col. 1, line 10, after "materials" insert --,--, after "and" insert --relates to--; after "employed" replace "therefor," by --therefor.--;

line 11, replace " and more" by --More--, replace "it" by --the invention--;

line 12, after "preventing" insert --the--;

line 17, replace "through" by --using--;

line 18, replace "example:" by --example.--;

line 22, before "previously" insert --first or--;

line 25, replace "which are provided with" by --carrying--;

line 40, replace "are" by --have been--;

line 43, delete "a" (second occurrence);

line 44, delete "therefore";

line 51, delete "portion";

line 53, delete "portion";

line 59, replace "vents to" by --vents,--; replace "transfer" by --so that as--, line 60, after "materials" insert --are transferred--;

line 62, delete "naturally discharging the";

line 63, after "residual air etc." insert --is discharged--.

Col. 2, line 8, replace "while" by --such that--;

line 14, after "by" insert --the--;

line 15, after "leads" insert --,--;

line 17, after "reliability" insert --,--;

UNITED STATES PATENT AND TRADEMARK OFFICE
CERTIFICATE OF CORRECTION

PATENT NO. : 5,753,538

DATED : May 19, 1998

INVENTOR(S) : Kuno et al.

It is certified that error appears in the above-identified patent and that said Letters Patent is hereby corrected as shown below:

line 25, replace "such a" by --this--;

line 46, replace "countermeasures:" by --countermeasures.--;

line 62, delete "portion";

line 65, delete "be";

line 66, replace "increased in size since the same" by --increase the overall size of the apparatus because it--, replace "in" (second occurrence) by --on--;

line 67, replace "mold, while" by --mold. Furthermore--;

Col. 3, line 1, after "means" insert --during--.

line 2, after "mold" insert --,--;

line 8, replace "times" by --the time--;

line 9, replace "are" by --is--.

line 18, replace "is" by --and the driving means for moving the same are--;

line 19, delete "with provision of the driving means for moving the same";

line 21, replace "thereby" by --which would disrupt the--;

line 22, after "isolating" insert --of--, delete "portion";

line 33, delete "portion";

line 37, delete "portion".

line 62, delete "a mold surface of".

line 65, replace "in" (first occurrence) by --into--;

Col. 4, line 2, after "parts" insert --,--, replace "frames in" by --frames, into--;

line 13, replace "space portion" by --space,--;

UNITED STATES PATENT AND TRADEMARK OFFICE
CERTIFICATE OF CORRECTION

PATENT NO. : 5,753,538

DATED : May 19, 1998

INVENTOR(S) : Kuno et al.

It is certified that error appears in the above-identified patent and that said Letters Patent is hereby corrected as shown below:

line 16, after "cavities" insert --,--;

line 17, delete "portion";

line 23, replace "space portion," by --space,--;

line 38, delete "portion";

line 43, after "in" insert --a--; after "closing" insert --direction--;

line 46, after "space" delete "portion";

line 63, replace "similarly" by --simultaneously--.

Col. 5,   line 12, replace "one" by --mold section--;

line 25, delete "no", after "is" insert --not--;

line 28, after "save" insert --on--;

line 37, after "step" insert --,--;

line 67, delete "portion".

Col. 6,   line 6, delete "portion";

line 8, delete "portion";

line 30, after "invention" insert --,--, replace "a state opened" by --an open state--;

line 45, after "view" insert --on an enlarged scale,--;

line 47, replace "Fig. 1, Fig. 5B is a partially" by --Fig. 1; --before "fragmented" insert --Fig. 5B is a partially--, after "view" insert --on an enlarged scale--;

line 50, replace "Fig. 2, and" by --Fig. 2; and--;

line 51, after "view" insert --on an enlarged scale--;

line 53, delete "respectively";

UNITED STATES PATENT AND TRADEMARK OFFICE
CERTIFICATE OF CORRECTION

PATENT NO. : 5,753,538

DATED : May 19, 1998

INVENTOR(S) : Kuno et al.

It is certified that error appears in the above-identified patent and that said Letters Patent is hereby corrected as shown below:

|  |  |
|---|---|
| | line 60, after "view" insert --on an enlarged scale--. |
| Col. 7, | line 7, replace "section 2 so that" by --section 2, with--; |
| | line 8, replace "are" by --or tablets R being---; |
| | line 9, replace "on side" by --to the sides--; |
| | line 10, delete "portions"; |
| | line 16, replace "cul" by --cull--; |
| | line 30, after "materials" insert --R--; |
| | line 43, replace "space portion" by --space,--; |
| | line 45, after "6" insert --,--; |
| | line 46, replace "(see Fig. 5A)." by --(see Figs. 5A, 5B, 5C).--. |
| Col. 8, | line 6, after "and" insert --thus--; |
| | line 14, delete "portion"; |
| | line 26, delete "expanded"; after "is" insert --still--; |
| | line 40, delete "por-"; |
| | line 41, delete "tion"; replace "on an upper side of" by --beside--, |
| | line 47, delete "portion"; |
| | line 51, delete "portion"; |
| | line 54, delete "portion"; |
| | line 55, delete "portion"; |
| | line 58, delete "portion"; after "heating" insert --,--; |
| | line 59, delete "portion"; |

UNITED STATES PATENT AND TRADEMARK OFFICE
CERTIFICATE OF CORRECTION

PATENT NO. : 5,753,538

DATED : May 19, 1998

INVENTOR(S) : Kuno et al.

It is certified that error appears in the above-identified patent and that said Letters Patent is hereby corrected as shown below:

line 60, replace "position and" by --position,--, replace "number of" by --number, and the--;

line 61, after "port" insert --or ports--;

Col. 9,  line 3, replace "between/arranged" by --between or arranged--;

line 7, delete "portion";

line 12, replace "through" by --using the--;

line 21, replace "are" by --have been--, replace "in" by --into--;

line 32, delete "portion";

line 33, replace "members" by --member--;

line 39, delete "portion";

line 45, replace "are" (first occurrence) by --have been--;

line 46, replace "in" by --into--;

line 55, delete "portion";

line 56, delete "portion";

line 57, replace "tablets R into" by --tablets R, to--;

line 58, delete "portion";

line 59, delete "portion";

line 61, delete "portion";

line 64, after "in" insert --the--, after "closing" insert --process--;

line 66, after "in" insert --the--, after "opening" insert --process,--.

UNITED STATES PATENT AND TRADEMARK OFFICE
CERTIFICATE OF CORRECTION

PATENT NO. : 5,753,538

DATED : May 19, 1998

INVENTOR(S) : Kuno et al.

It is certified that error appears in the above-identified patent and that said Letters Patent is hereby corrected as shown below:

Col.10, line 4, after "time" insert --,--;

line 11, after "of" insert --manufacturing--;

line 22, after "6" insert --,--;

line 23, replace "on side positions" by --to the sides--, after "pots 3" insert --,--;

line 25, replace "are" by --have been--;

line 34, delete "portion";

line 36, delete "portion";

line 43, delete "portion";

line 44, delete "portion";

line 65, replace "carry out" by --achieve an--; after "closing" insert --state--;

Col.11, line 2, delete "portion";

line 4, delete "portion";

line 7, after "other" insert --or brought into contact with each other--;

line 9, after "closing" insert --state--;

line 10, delete "portion";

line 13, delete "portion";

line 16, delete "portion";

line 17, after "20" insert --,--; after "closing" insert --,--;

line 18, after "state" insert --even--, after "by" insert --using--;

line 19, replace "of low dischargeability" by --having a low discharge rate--;

line 20, after "section 2" insert --in the intermediate closing state--;

line 38, after "other" insert --or face each other--;

UNITED STATES PATENT AND TRADEMARK OFFICE
CERTIFICATE OF CORRECTION

PATENT NO. : 5,753,538

DATED : May 19, 1998

INVENTOR(S) : Kuno et al.

It is certified that error appears in the above-identified patent and that said Letters Patent is hereby corrected as shown below:

line 56, after "members" insert --or components--;
        line 61, after "mold" insert --face--;
        line 62, after "31" insert --along a parting line P.L--.

Col.12, line 1, delete "portion";
        line 7, delete "portion";
        line 9, delete "portion";
        line 11, after "connected" insert --or contacted--;
        line 17, replace "in" by --into--;
        line 21, delete "portion";
        line 23, delete "portion";
        line 24, replace "tablets R into" by --Tablets R, to--; delete "portion";
        line 28, delete "portion";
        line 49, replace "at need" by --as needed--;
        line 53, replace "in" by --into--;
        line 57, replace "in" by --into--;
        line 62, after "Fig. 7" insert --in comparison to Fig. 1--.

Col. 13, line 4, replace "portions thereof" by --surfaces of the tablets--;
        line 5, after "pots 3" insert --,--; replace "space portions" by --spaces--;
        line 6, replace "surface portions thereof" by --surfaces of the tablets--;
        line 9, replace "surface" by --surfaces--;
        line 10, delete "portions" (both instances); replace "surface" by --surfaces--;
        line 12, replace "surface portions" (both instances) by --surfaces--;
        line 19, replace "to be" by --which are then--;
        line 20, replace "while" by --whereupon--; delete "portions" (second occurrence);.
        line 31, replace "this" by --the present--;
        line 32, after "of" (both instances) insert --the--;

UNITED STATES PATENT AND TRADEMARK OFFICE
CERTIFICATE OF CORRECTION

PATENT NO. : 5,753,538
DATED : May 19, 1998
INVENTOR(S) : Kuno et al.

It is certified that error appears in the above-identified patent and that said Letters Patent is hereby corrected as shown below:

| | |
|---|---|
| line 37, | after "melt" insert --the--; |
| line 38, | after "Fig. 7," insert --according to the present embodiment,--; |
| line 39, | after "at" insert --dimension--; replace "those" by --the diameters--; |
| line 46, | replace "surface portions" by --surfaces--; |
| line 47, | before "cull" insert --enlarged--; |
| line 49, | after "and" insert --thereafter--. |
| line 61, | delete "portion". |

Signed and Sealed this

Sixth Day of February, 2001

Q. TODD DICKINSON

*Attest:*

*Attesting Officer*          Director of Patents and Trademarks